US011196106B2

(12) United States Patent
Shimizu

(10) Patent No.: US 11,196,106 B2
(45) Date of Patent: Dec. 7, 2021

(54) SEMICONDUCTOR DEVICE AND REMAINING BATTERY LEVEL DETECTION METHOD

(71) Applicant: LAPIS SEMICONDUCTOR CO., LTD., Kanagawa (JP)

(72) Inventor: Takahiro Shimizu, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 199 days.

(21) Appl. No.: 16/519,927

(22) Filed: Jul. 23, 2019

(65) Prior Publication Data
US 2020/0036059 A1 Jan. 30, 2020

(30) Foreign Application Priority Data
Jul. 26, 2018 (JP) .............................. JP2018-140559

(51) Int. Cl.
*H01M 10/48* (2006.01)
*G01R 31/388* (2019.01)

(52) U.S. Cl.
CPC ........ *H01M 10/484* (2013.01); *G01R 31/388* (2019.01)

(58) Field of Classification Search
CPC ..... H01M 10/484; H01M 10/48; Y02E 60/10; G01R 31/388; G01R 31/367; G01R 31/3835
USPC ....................................................... 320/132
See application file for complete search history.

(56) References Cited

U.S. PATENT DOCUMENTS

| | | | | |
|---|---|---|---|---|
| 6,534,954 B1 * | 3/2003 | Plett | ...................... | H01M 10/48 320/132 |
| 6,624,636 B2 * | 9/2003 | Arai | ...................... | B60W 10/26 324/426 |
| 7,676,334 B2 * | 3/2010 | Matsuura | ........... | G01R 31/3648 702/63 |
| 8,664,919 B2 * | 3/2014 | Yamada | ............... | G01R 31/367 320/132 |
| 9,261,567 B2 * | 2/2016 | Yamada | ............... | G01R 31/367 |
| 10,261,132 B2 * | 4/2019 | Tohara | ................. | G01R 31/396 |
| 2013/0093430 A1 * | 4/2013 | Hagimori | ........... | G01R 31/3835 324/434 |

(Continued)

FOREIGN PATENT DOCUMENTS

| | | | |
|---|---|---|---|
| JP | H10153647 A | | 6/1998 |
| JP | 2004304940 A | * | 10/2004 |
| JP | 2005006449 A | * | 1/2005 |

*Primary Examiner* — M Baye Diao
(74) *Attorney, Agent, or Firm* — Volentine, Whitt & Francos, PLLC

(57) ABSTRACT

A semiconductor device including: a voltage detection section that outputs a first voltage and a second voltage that is different from the first voltage, the first voltage and the second voltage being voltages of a connected battery; a correction section that, on the basis of potential differences between the first voltage and second voltage, derives second data from first data, the first data representing a relationship between remaining battery levels and open circuit voltages, and the second data representing a relationship between remaining battery levels and battery voltages; and a calculation section that calculates a remaining level of the battery on the basis of a remaining battery level corresponding to a minimum voltage in the second data and outputs the calculated remaining level of the battery.

10 Claims, 5 Drawing Sheets

(56) References Cited

U.S. PATENT DOCUMENTS

2013/0119898 A1\* 5/2013 Ohkura ............. H01M 10/4207
318/139
2017/0141444 A1\* 5/2017 Kawahara ........... G01R 31/3828
2018/0080993 A1\* 3/2018 Shimizu ............... G01R 31/382

\* cited by examiner

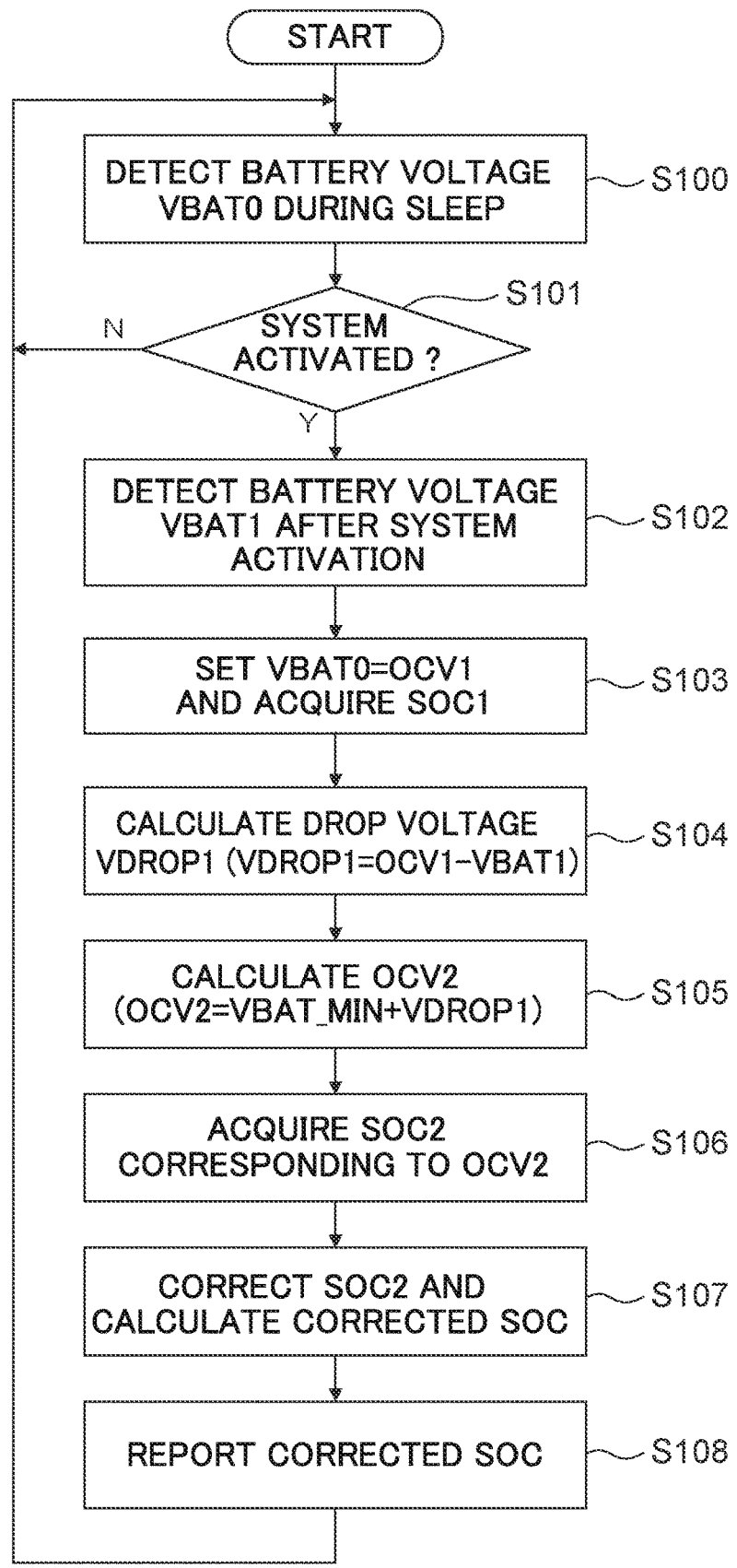

FIG.4

| SOC (%) | OCV (V) |
|---:|---:|
| 100 | 4.20 |
| 90 | 4.07 |
| 80 | 3.99 |
| 70 | 3.93 |
| 60 | 3.87 |
| 50 | 3.82 |
| 40 | 3.79 |
| 30 | 3.77 |
| 20 | 3.74 |
| 10 | 3.69 |
| 0 | 3.40 |
| −10 | 2.20 |

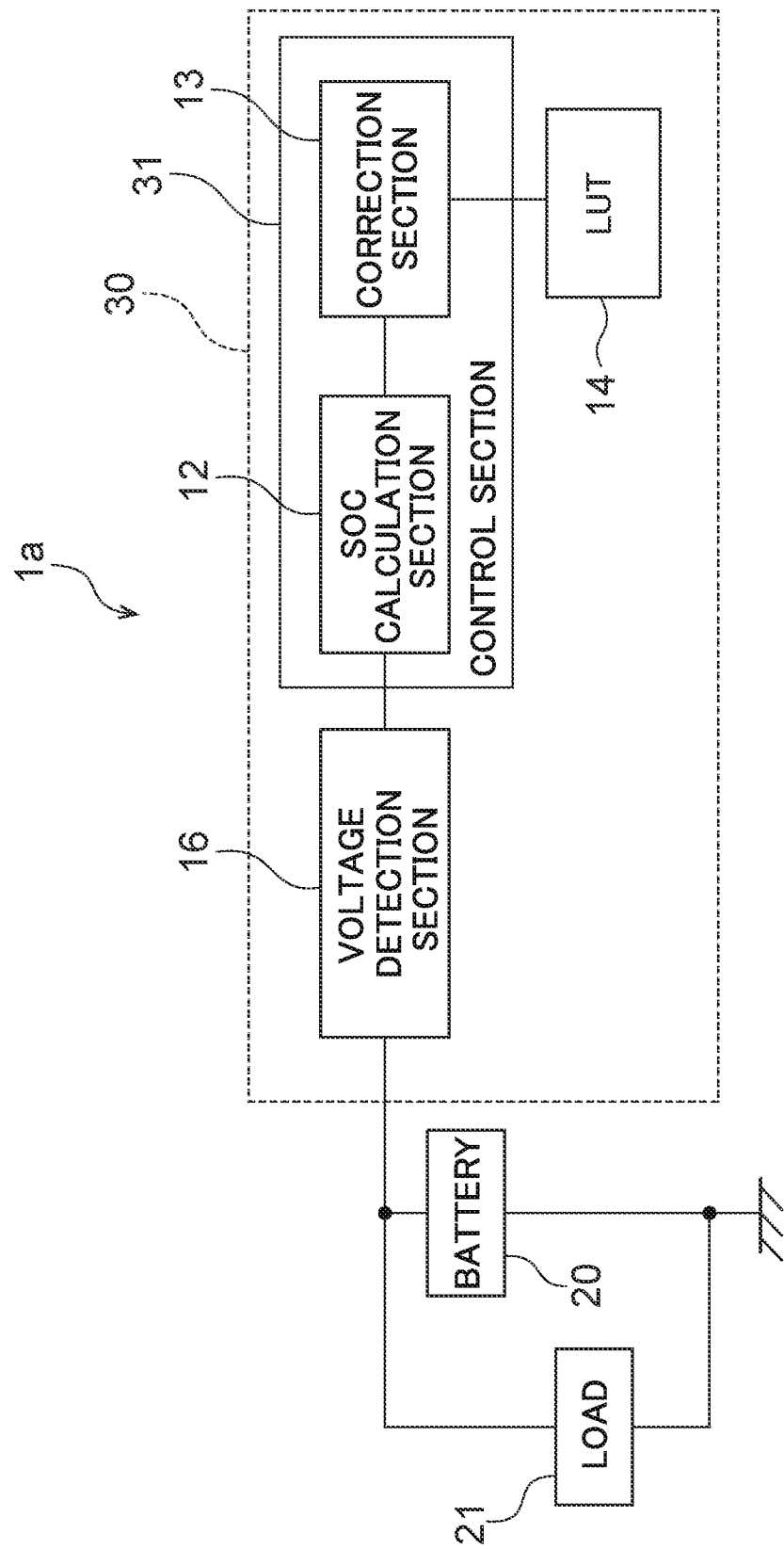

SEMICONDUCTOR DEVICE AND REMAINING BATTERY LEVEL DETECTION METHOD

CROSS-REFERENCE TO RELATED APPLICATION

This application claims priority under 35 USC 119 from Japanese Patent Application No. 2018-140559, filed on Jul. 26, 2018, the disclosure of which is incorporated by reference herein.

BACKGROUND

Technical Field

The present disclosure relates to a semiconductor device and to a method for detecting a remaining level of a battery.

Related Art

Methods for detecting the remaining level of a battery are broadly divided into voltage methods and coulomb-counting methods. In general, remaining battery level detection methods based on voltage provide lower accuracy and remaining battery level detection methods based on coulomb-counting provide improved accuracy. A coulomb-counting method employs a voltage detection circuit, a coulomb-counter circuit and a sense resistance to detect the remaining level of a battery (which may below be referred to as the "state of charge" (SOC)), and reports the results to a system connected to the battery.

For example, Japanese Patent Application Laid-Open (JP-A) No. H10-153647 discloses a remaining battery level detection by using voltages. The remaining battery level detection method disclosed in JP-A No. H10-153647 includes, the battery as a power supply: voltage measuring means that measures voltages of the power supply; loading means that produces a pre-specified load; and remaining level detecting means that measures respective output voltages of the power supply in an unloaded state and a loaded state by the loading means, and reports a remaining level of the battery based on the measured values. Further, a table is provided that relates voltage differences between the state when the load is applied to the battery and the state when the battery is unloaded with usage durations of the battery. Thus, the remaining battery level is determined from this voltage difference.

However, in the coulomb-counting method described above, two circuits (a voltage detection circuit and a coulomb-counter circuit) and a sense resistance are required. Consequently, the device is large and high in cost. Therefore, particularly in regard to price, it is difficult to employ coulomb-counting in a low-price system (for example, an Internet of Things (IoT) wireless sensor terminal or the like).

In the method disclosed in JP-A No. H10-153647, accurate measurement of the remaining battery level is difficult if the load applied to the battery varies. Accurate measurement of the remaining battery level is also difficult when the voltage difference between the state in which the load is applied to the battery and the state in which the battery is unloaded varies in association with deterioration of the battery.

One technique to improve measurement accuracy in relation to deterioration of a battery is to provide plural tables relating voltage differences with usage durations of the battery in accordance with deterioration of the battery. However, large amounts of time and cost are required to obtain voltage differences corresponding with deterioration of the battery for this technique, and a memory volume required to store the tables is large. Particularly in equipment used in the aforementioned IoT and the like, reductions in cost and size of a remaining battery level detection device are desired, and providing plural tables is troublesome.

SUMMARY

The present disclosure provides a semiconductor device and a remaining battery level detection method that may, with a simple configuration, raise accuracy, reduce size and lower costs.

A first aspect of the present disclosure is a semiconductor device including: a voltage detection section that outputs a first voltage and a second voltage that is different from the first voltage, the first voltage and the second voltage being voltages of a connected battery; a correction section that, on the basis of potential differences between the first voltage and second voltage, derives second data from first data, the first data representing a relationship between remaining battery levels and open circuit voltages, and the second data representing a relationship between remaining battery levels and battery voltages; and a calculation section that calculates a remaining level of the battery on the basis of a remaining battery level corresponding to a minimum voltage in the second data and outputs the calculated remaining level of the battery.

A second aspect of the present disclosure is a remaining battery level detection method including: detecting a first voltage and a second voltage that is different from the first voltage, the first voltage and the second voltage being voltages of a connected battery; deriving, on the basis of potential differences between the first voltage and second voltage, second data from first data, the first data representing a relationship between remaining battery levels and open circuit voltages, and the second data representing a relationship between remaining battery levels and battery voltages; calculating a remaining level of the battery on the basis of a remaining battery level corresponding to a minimum voltage in the second data; and outputting the calculated remaining level of the battery.

According to the above aspects, a semiconductor device and a remaining battery level detection method of the present disclosure may, with a simple configuration, raise accuracy, reduce size and lower costs.

BRIEF DESCRIPTION OF THE DRAWINGS

Exemplary embodiments will be described in detail based on the following figures, wherein:

FIG. 3 is a flowchart illustrating a flow of a remaining battery level detection processing program according to the exemplary embodiment;

FIG. 4 is a diagram illustrating an example of an OCV-SOC table according to the exemplary embodiment; and FIG. 5 is a block diagram illustrating an alternative example of the battery-using system according to the exemplary embodiment.

DETAILED DESCRIPTION

Below, an exemplary embodiment for carrying out the present disclosure is described in detail with reference to the attached drawings.

A semiconductor device and a remaining battery level detection method according to the present exemplary embodiment are described with reference to FIG. 1 to FIG. 4. In the present exemplary embodiment, the semiconductor device and the remaining battery level detection method, which detect a remaining level of a battery, are illustrated and described for a system (below referred to as "the battery-using system") that is supplied with electricity by the battery and implements predetermined functions. That is, the semiconductor device according to the present exemplary embodiment includes a remaining battery level detection device. An IoT device is illustrated as an example of the battery-using system. More specifically, a sensor system that measures and monitors a physical quantity of a predetermined object, or the like, can be mentioned.

Figure 1:
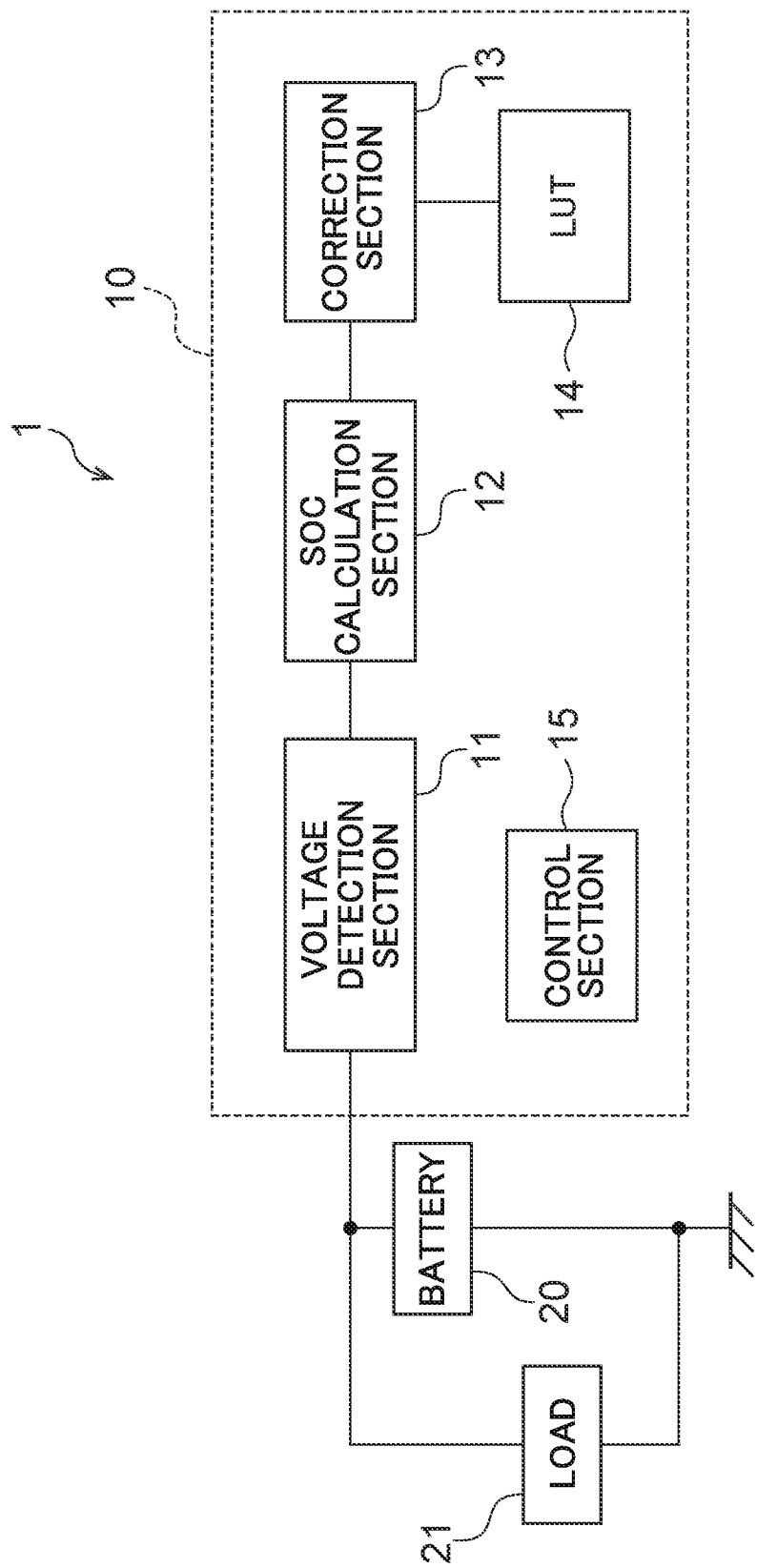
FIG. 1 is a block diagram illustrating configurations of a battery-using system according to an exemplary embodiment.

As shown in FIG. 1, a battery-using system 1 according to the present exemplary embodiment includes a semiconductor device 10, a battery 20 and a load 21. That is, the battery-using system 1 is not equipped with a coulomb-counter circuit and a sense resistance as in the conventional technology described above.

The type of the battery 20 is not particularly limited but in the present exemplary embodiment, as an example, a lithium-ion cell is employed. In a case in which the open circuit voltage (OCV) is 4.2 V, the lithium-ion cell is in a fully charged state; that is, the SOC is 100%. The meaning of the term "OCV" as used herein is intended to include a voltage of a battery in a state in which a load is not connected and no voltage or current is applied to a load. The meaning of the term "SOC" is intended to include a state of charging of a battery, with a fully discharged state according to specifications being represented as 0% and a fully charged state being represented as 100%.

The load 21 is a circuit that is supplied with voltage and current for operation by the battery 20, and is a section that implements a principal function of the battery-using system 1. As mentioned above, as an example in the present exemplary embodiment, the battery-using system 1 is a sensor system. The load 21 includes a sensor driving circuit of the sensor system, a transmitter that transmits monitoring information to a monitoring system, and the like.

As shown in FIG. 1, the semiconductor device 10 according to the present exemplary embodiment includes a voltage detection section 11, a SOC calculation section 12, a correction section 13, a look-up table (LUT) 14 and a control section 15.

The voltage detection section 11 detects (measures) a voltage between the two ends of the battery 20 (below referred to as the "battery voltage VBAT") in a state in which the load 21, which is constituted by the sensor system, is connected to the battery 20. The SOC calculation section 12 calculates a SOC by remaining battery level detection processing, which is described below. The correction section 13 corrects the SOC in accordance with the remaining battery level detection processing. The LUT 14 is a table used in look-up processing of the remaining battery level detection processing. The control section 15 principally executes the remaining battery level detection processing. The control section 15 includes, for example, a central processing unit (CPU), read-only memory (ROM), random access memory (RAM) and so forth, which are not shown in the drawings. The control section 15 controls the voltage detection section 11, the SOC calculation section 12 and the correction section 13.

In order to suppress power consumption in a sensor system such as an IOT wireless sensor terminal, such as the battery-using system 1 according to the present exemplary embodiment, it is common for most operations to be conducted in a sleep state. The meaning of the term "sleep state" includes a state in which energy is conserved while a power supply remains connected. Accordingly, the load 21 constituted by the sensor system cycles between sleep intervals Ts in the sleep state and active intervals Ta in an activated state.

Figure 2A:
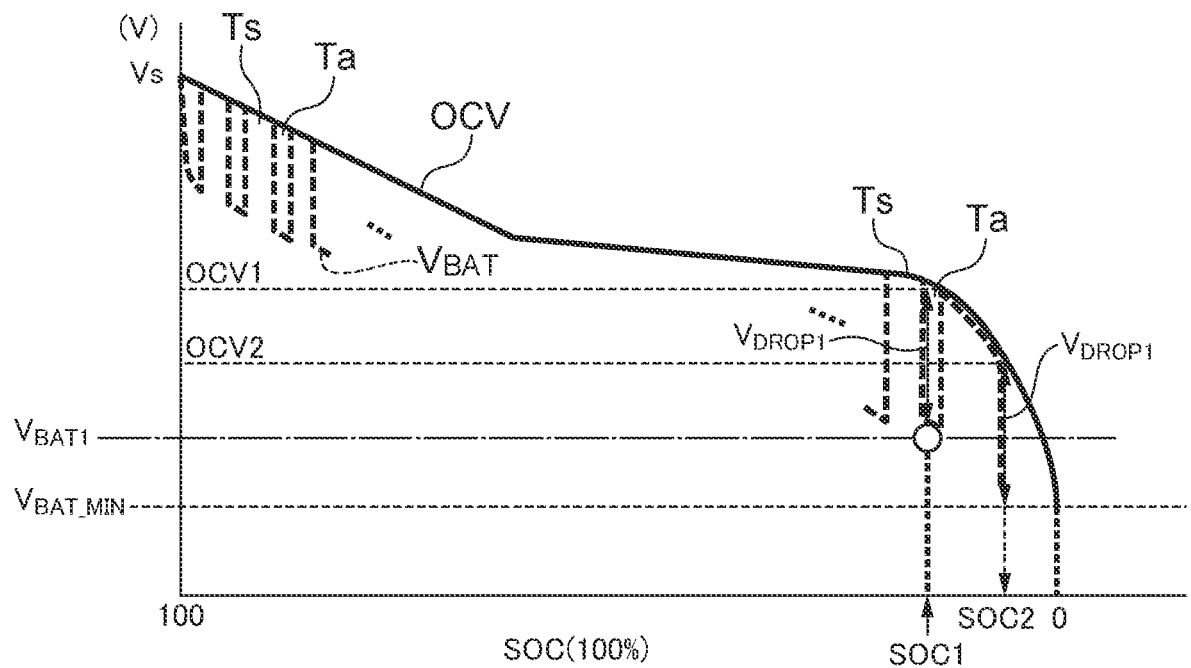
FIG. 2A is a diagram illustrating a concept of remaining battery level detection processing according to the exemplary embodiment.

The relationship between sleep intervals Ts and active intervals Ta, the OCV and the battery voltage VBAT is described with reference to FIG. 2A. The solid line in FIG. 2A illustrates a relationship between battery remaining capacities, that is, SOC and open circuit voltages, that is, OCV. When battery voltages VBAT are measured in respective periods of the sleep intervals Ts and the active intervals Ta, the results becomes as illustrated by the broken lines in FIG. 2A. That is, the battery voltages VBAT measured by the voltage detection section 11 in the active intervals Ta are lower due to a voltage drop, and the battery voltages VBAT in the sleep intervals Ts are higher. In this case, since the battery-using system 1 has many sleep intervals Ts, the battery voltage VBAT during the most recent sleep before a system activation is close to the OCV. Therefore, the battery voltage VBAT at this time can be regarded as being equal to the OCV at this time. The semiconductor device and remaining battery level detection method according to the present exemplary embodiment detect the remaining battery level by focusing on this point. The value Vs shown in FIG. 2 is an initial value of the OCV. Because the present exemplary embodiment employs a lithium-ion cell as the battery 20, Vs is approximately 4.2 V.

Now, the remaining battery level detection processing that is executed by the semiconductor device 10 according to the present exemplary embodiment is described with reference to FIG. 3 and FIG. 2A. FIG. 3 is a flowchart illustrating a flow of a remaining battery level detection processing program according to the present exemplary embodiment. In the semiconductor device 10 according to the present exemplary embodiment, the start of the processing shown in FIG. 3 is commanded via a user interface section (UI) or the like that is not shown in the drawings. The CPU (not shown in the drawings) provided at the control section 15 reads the remaining battery level detection processing program, which is stored in storage means such as the ROM or the like, loads the program into the RAM or the like, and executes the program.

In the remaining battery level detection processing according to the present exemplary embodiment, as the remaining level of the battery 20 that changes in association with usage of the battery-using system 1 is detected (estimated), the SOC at a current time is obtained using the most recent estimate of the OCV of the battery 20, which also changes in association with usage of the battery-using system 1. From SOCs that are obtained, a predicted SOC at which the battery 20 will become unusable with the battery-using system 1 is calculated. Thus, although errors are a common problem in the detection of remaining level of a battery, in the present exemplary embodiment the remaining level of the battery 20 at any time is always predicted using the most recent OCV. Therefore, accuracy may be improved compared to conventional technologies.

First, in steps S100 and S101, the battery-using system 1 waits for activation while detecting a battery voltage VBAT0 with the voltage detection section 11 during sleep (that is, in a sleep interval Ts). In this period, the control section 15 of the semiconductor device 10 controls the voltage detection section 11 while conducting operations in an energy conservation mode. The detection of the battery voltage VBAT0 may be conducted periodically at intervals of a pre-specified duration. Thus, whenever the battery-using system 1 is activated, the battery voltage VBAT0 has been detected recently. Detected values of the battery voltage VBAT0 may be retained as a history in storage means such as the RAM or the like, which is not shown in the drawings, and the most recent value may be continuously updated.

In step S102, after the battery-using system 1 is activated (that is, in an active interval Ta), the control section 15 detects a battery voltage VBAT1 with the voltage detection section 11. In consideration of a change in state caused by driving of the battery 20, it is preferable if the battery voltage VBAT1 is detected as soon as possible after the battery-using system 1 transitions into a stable state after the battery-using system 1 has been activated. Regarding the timing at which the battery voltage VBAT1 is measured, the remaining battery level may be detected with higher accuracy by acquiring a battery voltage VBAT with a low voltage value in the state in which a load is applied by operation of the load 21 constituted by the sensor system to be used as the battery voltage VBAT1 (namely, using a minimum value of battery voltages VBAT measured in the active interval Ta as the battery voltage VBAT1).

In step S103, the control section 15 controls the SOC calculation section 12 and, as illustrated in FIG. 2A, assumes that the battery voltage VBAT0 is OCV1, which is the current OCV (at the time of battery remaining level detection). Thus, the control section 15 acquires SOC1, which is the SOC at the time of battery remaining level detection. The SOC and OCV of the battery 20 have a consistent relationship illustrated by, for example, the solid line in FIG. 2A. Accordingly, a table or the like of this relationship may be created in advance (below referred to as the "OCV-SOC table"), the OCV-SOC table may be referred to when necessary, and SOC1 (the SOC at the time of battery remaining level detection) may be obtained from OCV1. FIG. 4 shows an example of the OCV-SOC table. This OCV-SOC table is used as the LUT 14 according to the present exemplary embodiment. The OCV-SOC table may be stored in storage means such as, for example, the ROM that is not shown in the drawings or the like. A description of the relationship between OCV and SOC is not limited to a table as in FIG. 4. The relationship between OCV and SOC may be described by, for example, a mathematical expression.

In step S104, the control section 15 controls the SOC calculation section 12 to calculate a drop voltage VDROP1, which is shown in FIG. 2A, using the following expression (expression 1).

$$\mathrm{VDROP1=OCV1-VBAT1} \quad \text{(expression 1)}$$

The drop voltage VDROP1 denotes a drop in the battery voltage VBAT at the time of batter remaining level detection from the OCV at the time of battery remaining level detection.

In step S105, the control section 15 controls the SOC calculation section 12 to calculate OCV2, which is shown in FIG. 2A, using the following expression (expression 2).

$$\mathrm{OCV2=VBAT\_MIN+VDROP1} \quad \text{(expression 2)}$$

VBAT_MIN denotes a minimum value of the battery voltage VBAT (a minimum battery voltage) below which the battery-using system 1 may not operate properly. A specific value of the minimum battery voltage VBAT_MIN is, for example, 3.4 V.

In step S106, the control section 15 controls the SOC calculation section 12 to use the OCV-SOC table (see FIG. 4) to acquire the value of SOC2 corresponding with OCV2 (see FIG. 2A).

In step S107, the control section 15 controls the correction section 13 to correct SOC2 using the following expressions (expression 3 to expression 5) and calculate a corrected SOC.

$$\mathrm{NewSOCFull=100-SOC2} \quad \text{(expression 3)}$$

$$\mathrm{NewSOCNow=SOC1-SOC2} \quad \text{(expression 4)}$$

$$\mathrm{Corrected\ SOC=(NewSOCNow/NewSOCFull)\times 100} \quad \text{(expression 5)}$$

Here, SOC2 is a SOC that corresponds to the minimum battery voltage VBAT_MIN, but is not yet at zero. Accordingly, SOC1 is calculated as a corrected SOC at the time of remaining battery level detection assuming that SOC2=0 (zero). As a result, the remaining level of the battery 20 may be determined directly from the corrected SOC.

In step S108, the control section 15 controls the UI that is not shown in the drawings and reports the corrected SOC. Thereafter, the control section 15 returns to step S100 and waits until the battery-using system 1 activates again. The report of the corrected SOC may be, as mentioned above, a report via the UI of the battery-using system 1 that is not shown in the drawings or the like, and may be a report by an alternative method. The present remaining battery level detection processing program may stop, for example, when a power supply of the battery-using system 1 is turned OFF. After the remaining battery level detection processing of the flowchart shown in FIG. 3 has been executed once in an active interval Ta, there is no need in principle to execute the processing a second or further time. Therefore, a flag may be set after the corrected SOC is reported in step S108, stopping further processing during the current active interval Ta.

Figure 2B:
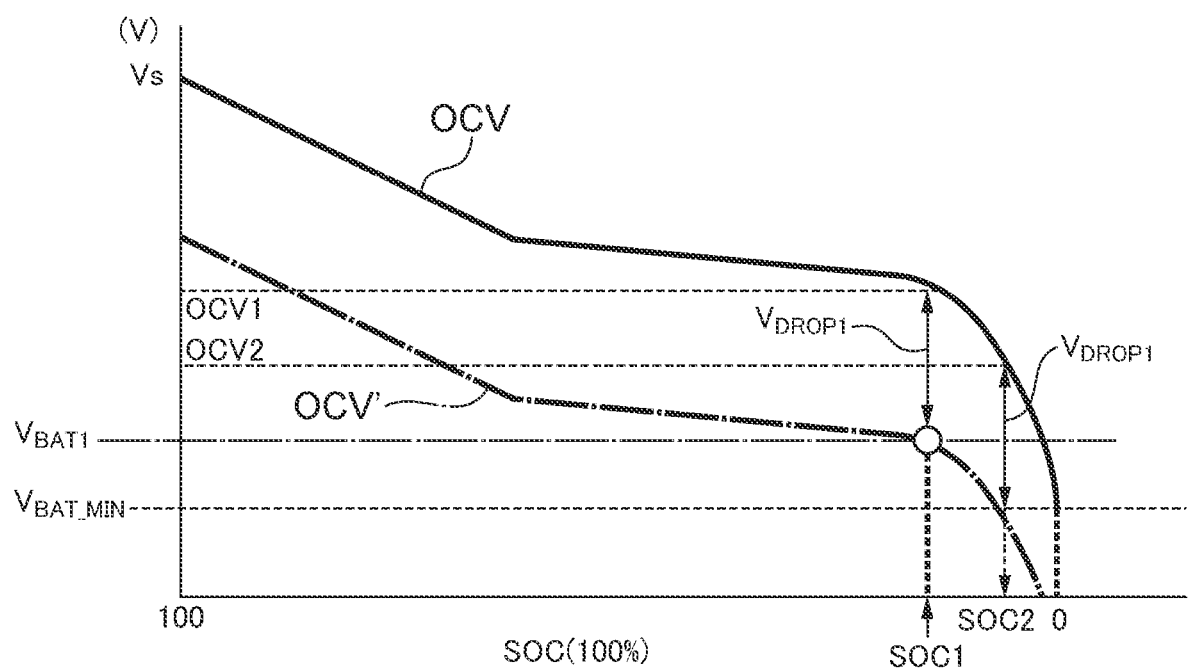
FIG. 2B is a diagram illustrating an alternative method of remaining battery level detection processing according to the exemplary embodiment.

An alternative method for calculating the SOC at a time of remaining battery level detection is described with reference to FIG. 2B.

Step 1: VDROP1 is subtracted from OCVs corresponding to SOCs shown in FIG. 2A, shifting the OCV curve down to the OCV' curve shown in FIG. 2B. Below, the OCV' curve is referred to as "the VBAT-SOC curve". That is, the OCV' curve may be regarded as changes of the battery voltage VBAT in this alternative method.

Step 2: A portion at which the VBAT-SOC curve crosses VBAT_MIN is set as SOC=0%. Step 3: The current SOC is calculated and set as the current remaining battery level assuming that the portion of the curve that crosses VBAT_MIN corresponds to SOC=0%.

According to the semiconductor device and remaining battery level detection method according to the present exemplary embodiment, a current SOC may be detected without using a coulomb-counter circuit and a sense resistance. Thus, a semiconductor device and a remaining battery level detection method may be provided that may, with a simple configuration, raise accuracy, reduce size and lower costs.

Second data (the VBAT-SOC curve), which represent the relationship between remaining battery level (state of charge) and battery voltage (VBAT) in the state in which a load is applied, are obtained by subtracting potential difference values (VDROP1) between first voltages and second voltages from open circuit voltage values in first data (the OCV-SOC table), which represent the relationship between remaining battery level (SOC) and open circuit voltage (OCV) when a battery-using system wakes up from a sleep state. A current remaining battery level is estimated/updated from the second data and a minimum voltage required for operation of the battery-using system (VBAT_MIN). Thus, without plural tables relating voltage differences with battery usage durations having to be prepared, a remaining battery level may be estimated with high accuracy, without being affected by variations in load voltage or deterioration of the battery. The present exemplary embodiment focuses on and makes use of the phenomenon of the drop voltage VDROP1 increasing with the passing of usage time of the battery.

An alternative example of the present exemplary embodiment described above is described with reference to FIG. 5. In the present alternative example, the semiconductor device 10 according to the present exemplary embodiment is embodied using a microcontroller unit (MCU). In the exemplary embodiment described above, the dedicated voltage detection section 11 is used so as to enable measurement of the battery voltage VBAT even during sleep. In contrast, in the present alternative example, an analog-digital converter (ADC) incorporated in a general-purpose MCU is employed as a voltage detection circuit and the SOC calculation section 12 and correction section 13 are implemented by software.

FIG. 5 shows a battery-using system 1a according to the present alternative example. As shown in FIG. 5, an MCU 30 according to the present alternative example includes a voltage detection section 16, a control section 31 and the LUT 14. In the following descriptions, configurations that are the same as in the battery-using system 1 shown in FIG. 1 are assigned the same reference symbols and are not described in detail.

As described above, the voltage detection section 16 according to the present alternative example is constituted using the ADC of the MCU 30. The control section 31 includes the SOC calculation section 12 and the correction section 13 and, as mentioned above, is constituted by software in the present alternative example.

In the battery-using system 1a according to the present alternative example, a battery voltage is detected by the voltage detection section 16 after the MCU 30 is activated. For example, the MCU 30 is activated in a low power consumption mode and the voltage is detected, after which the MCU 30 is switched into a usual operation mode and the remaining battery level detection processing is executed. When the MCU 30 is operated in the low power consumption mode, the voltage drop is suppressed. Consequently, the battery voltage VBAT at the time of remaining level detection may be regarded as being the OCV and a current SOC may be detected.

The remaining battery level detection processing according to the present alternative example is basically executed in accordance with the flowchart shown in FIG. 3, but differs in the initial state of the battery-using system. To be specific, in step S100 of FIG. 3, "during sleep" may be replaced with "during low power consumption".

According to the semiconductor device and remaining battery level detection method of the present exemplary embodiment as described above, a current SOC (at a time of remaining battery level detection) may be detected with just a general-purpose MCU. Therefore, a further reduction in costs can be anticipated.

What is claimed is:

1. A semiconductor device comprising:
a voltage detection section that outputs a first voltage and a second voltage that is different from the first voltage, the first voltage and the second voltage being voltages of a connected battery;
a correction section that derives second data from first data by subtracting potential difference values between the first voltage and the second voltage from an open circuit voltage value included in the first data, the first data representing a relationship between remaining battery levels and open circuit voltages, and the second data representing a relationship between the remaining battery levels and battery voltages; and
a calculation section that calculates a remaining level of the battery based on a remaining battery level corresponding to a minimum voltage in the second data and outputs the calculated remaining level of the battery.

2. The semiconductor device according to claim 1, wherein the first voltage is an open circuit voltage of the battery, and the second voltage is a voltage in a state in which a load is connected to the battery.

3. The semiconductor device according to claim 1, wherein the second data represents a relationship between the remaining battery levels and a value of the battery voltages, the value of the battery voltages being obtained by subtracting the potential differences from the first data.

4. The semiconductor device according to claim 1, further comprising a control section that causes the voltage detection section to output the first voltage during a sleep state and causes the voltage detection section to output the second voltage during a loading state.

5. The semiconductor device according to claim 4, wherein the control section causes the voltage detection section to output a lowest voltage as the second voltage during the loading state.

6. A remaining battery level detection method comprising:
detecting a first voltage and a second voltage that is different from the first voltage, the first voltage and the second voltage being voltages of a connected battery;
deriving second data from first data by subtracting potential difference values between the first voltage and the second voltage from an open circuit voltage value included in the first data, the first data representing a relationship between remaining battery levels and open circuit voltages, and the second data representing a relationship between the remaining battery levels and battery voltages;
calculating a remaining level of the battery based on a remaining battery level corresponding to a minimum voltage in the second data; and
outputting the calculated remaining level of the battery.

7. The remaining battery level detection method according to claim 6, wherein the first voltage is an open circuit voltage of the battery, and the second voltage is a voltage in a state in which a load is connected to the battery.

8. The remaining battery level detection method according to claim 6, wherein the second data represents a relationship between the remaining battery levels and a value of the battery voltages, the value of the battery voltages are obtained by subtracting the potential differences from the first data.

9. The remaining battery level detection method according to claim 6, wherein the first voltage is output from a voltage detection section by a control section during a sleep state and the second voltage is output during a loading state.

10. The remaining battery level detection method according to claim 9, wherein a lowest voltage during loading is output from the voltage detection section by the control section as the second voltage.

\* \* \* \* \*